US010024920B2

(12) United States Patent
Pan et al.

(10) Patent No.: US 10,024,920 B2
(45) Date of Patent: Jul. 17, 2018

(54) SYSTEMS AND METHODS FOR SWING ANGLE ESTIMATION IN AN ELECTRICAL POWER SYSTEM

(71) Applicant: General Electric Company, Schenectady, NY (US)

(72) Inventors: Yan Pan, Niskayuna, NY (US); William James Premerlani, Scotia, NY (US)

(73) Assignee: General Electric Company, Schenectady, NY (US)

( * ) Notice: Subject to any disclaimer, the term of this patent is extended or adjusted under 35 U.S.C. 154(b) by 1037 days.

(21) Appl. No.: 13/968,684

(22) Filed: Aug. 16, 2013

(65) Prior Publication Data

US 2015/0051850 A1 Feb. 19, 2015

(51) Int. Cl.
*G01R 31/34* (2006.01)
*G01R 19/25* (2006.01)
(Continued)

(52) U.S. Cl.
CPC ....... *G01R 31/343* (2013.01); *G01R 19/2513* (2013.01); *H02H 3/382* (2013.01); *H02J 3/24* (2013.01)

(58) Field of Classification Search
CPC .. G01R 31/343; G01R 19/2513; H02H 3/382; H02J 3/24
See application file for complete search history.

(56) References Cited

U.S. PATENT DOCUMENTS 5,731,943 A  3/1998 Roberts et al.
6,104,182 A * 8/2000 Jurisch ................... G01R 21/10
324/140 R
(Continued)

FOREIGN PATENT DOCUMENTS

CN         1429043 A    7/2003
CN       101807789 A    8/2010
(Continued)

OTHER PUBLICATIONS

Mechraoui A et al., "A New Blocking Principle With Phase and Earth Fault Detection During Fast Power Swings for Distance Protection", IEEE Transactions on Power Delivery, IEEE Service center, New York, vol. 10, Issue No. 3, pp. 1242-1248, Jul. 1, 1995.
(Continued)

*Primary Examiner* — Mohamed Charioui
*Assistant Examiner* — Jeremy Delozier
(74) *Attorney, Agent, or Firm* — GE Global Patent Operation; Nitin Joshi (57) ABSTRACT

In accordance with one embodiment, a method for detection of power swing for at least a first range of swing angles between an internal voltage ($E_S$) of a source-end generator and an internal voltage ($E_R$) of a receiving-end generator is provided. The method includes obtaining a voltage magnitude ($V_S$) of the source-end generator, and a current magnitude ($I_S$) of the source-end generator. The method further includes estimating a total reactance (X) between the source-end generator and the receiving-end generator, and estimating a first swing angle ($\theta$) between the $E_S$ and the $E_R$ as a function of the obtained $V_S$, the obtained $I_S$ and the estimated X. The method further includes detecting a power swing condition based on the estimated $\theta$.

17 Claims, 5 Drawing Sheets

(51) Int. Cl.
*H02J 3/24* (2006.01)
*H02H 3/38* (2006.01)

(56) References Cited

U.S. PATENT DOCUMENTS

| | | | |
|---|---|---|---|
| 6,476,521 | B1 | 11/2002 | Lof et al. |
| 7,457,088 | B2 | 11/2008 | Hou et al. |
| 7,930,117 | B2 | 4/2011 | Guzman-Casillas |
| 8,207,708 | B2 | 6/2012 | Morinaga et al. |
| 8,340,930 | B2 | 12/2012 | Gajic |
| 8,369,055 | B2 | 2/2013 | Cvorovic et al. |
| 2006/0067095 | A1* | 3/2006 | Hou .......... H02J 3/24 363/78 |
| 2011/0022240 | A1 | 1/2011 | Rajapaske |
| 2011/0102952 | A1* | 5/2011 | Yelgin .......... H02H 1/04 361/18 |
| 2012/0123602 | A1 | 5/2012 | Sun et al. |
| 2012/0292904 | A1 | 11/2012 | Tarnowski |
| 2013/0066480 | A1 | 3/2013 | Glavic et al. |
| 2014/0032138 | A1 | 1/2014 | Shrestha et al. |
| 2014/0071565 | A1 | 3/2014 | Blumschein et al. |
| 2014/0118864 | A1 | 5/2014 | Som et al. |
| 2015/0051852 | A1 | 2/2015 | Pan et al. |

FOREIGN PATENT DOCUMENTS

| | | |
|---|---|---|
| EP | 0869599 A2 | 10/1998 |
| JP | 3257386 A | 11/1991 |
| JP | 4092617 B2 | 5/2008 |

OTHER PUBLICATIONS

C. Liu et al, "Application of a Novel Fuzzy Neural Network to Real-Time Transient Stability Swings Prediction Based on Synchronized Phasor Measurements," IEEE Transactions on Power Systems, vol. 14, Issue No. 2, May 1999.

Segui T et al., "Fundamental Basis for Distance Relaying with Parametrical Estimation", IEEE Transactions on Power Delivery, New York, vol. No. 15, Issue No. 2, Apr. 1, 2000.

European Search Report and Opinion issued in connection with corresponding EP Application No. 14180548.1 dated Aug. 28, 2015.

Benmouyal et al., "Zero-Setting Power-Swing Blocking Protection", Schweitzer Engineering Laboratories, Inc, 2004, pp. 1-29.

Khoradshadi-Zadeh, "Evaluation and Performance Comparison of Power Swing Detection Algorithms", IEEE Power Engineering Society General Meeting, vol. 2, Jun. 12-16, 2005, pp. 1842-1848.

Danku et al., "Fast Prediction of the Power-Swing Curve Across Transmission Lines During Wide Area Disturbances", Power Systems Conference, PSC '09., Mar. 10-13, 2009, Location: Clemson, SC, pp. 1-5.

Fischer et al., "Do System Impedances Really Affect Power Swings—Applying Power Swing Protection Elements Without Complex System Studies", Previously presented at the 2012 Texas A&M Conference for Protective Relay Engineers, Mar. 15, 2013, pp. 1-12.

Stanton et al. "A Center-of-Inertia Transform Applied to Transient Responses of Nonlinear Power Systems", Proceedings of the Twenty-First Annual North-American Power Symposium, pp. 205-210, Oct. 1989.

Paudyal et al. "Application of Equal Area Criterion Conditions in the Time Domain for Out-of-Step Protection", IEEE Transactions on Power Delivery, vol. No. 25, Issue No. 02, pp. 600-609, Apr. 2010.

European Search Report and Opinion issued in connection with related EP Application No. 15190082.6 dated Aug. 18, 2016.

Machine Translation and Copy of First Office Action and Search issued in connection with corresponding CN Application No. 201410401864.4 dated Aug. 31, 2017.

\* cited by examiner

SYSTEMS AND METHODS FOR SWING ANGLE ESTIMATION IN AN ELECTRICAL POWER SYSTEM

BACKGROUND

An electrical power system operates under a steady-state condition when there exists a balance between generated and consumed active power for the system. Power system disturbances may cause oscillations in machine rotor angles that can result in conditions like a power swing, when internal voltages of system generators slip relative to each other. Power system faults, line switching, generator disconnection, or the loss or sudden application of large amounts of load are examples of system disturbances that may cause a power swing event to occur in a power system. Depending on the severity of the disturbance and power system control actions, the system may return to a stable state or experience a large separation of load angle and eventually lose synchronism. Large power swings, stable or unstable, may cause unwanted relay operations at different locations in the system, which can aggravate the system disturbance and can result in major power outages or blackouts.

Further, asynchronous operation of interconnected generators in the power system as an effect of unstable power swing may initiate uncontrolled tripping of circuit breakers resulting in equipment damage and posing a safety concern for utility operators. Therefore, the asynchronous system areas may need to be separated from each other quickly and dynamically in order to avoid extensive equipment damage and shutdown of major portions of the system. In order to contain these risks, it is required as per international standards to have an optimal generator protection device, such as a generator relay, in place to isolate generators from the rest of the system within a half-slip cycle. The need to meet the international standards challenges protection engineers to ensure selective and reliable relay operation.

In a conventional relaying approach, a variation in system impedance determined at generator terminals is analyzed for detecting power swing. Various impedance-based protection approaches including power swing block (PSB) and out-of step trip (OST) are currently being used. However, these protection approaches may need an extensive power system stability study to arrive at an optimal setting for selective and reliable relay operation. Protection engineers typically use preliminary settings that are not adapted to accommodate variation in system configurations or operational dynamics, for example, changes in transmission and distribution layout during implementation phase or dynamically during operational phase. Extensive study and non-dynamic preliminary settings may result in the protection device being unable to selectively, reliably and dependably detect power swings and isolate generators during such events.

Other known relaying approaches estimate swing center voltage (SCV) for detecting power swings. Such approaches use approximate estimation that does not take into consideration real time power system dynamics. In some relaying approaches, a high-speed communication network such as fiber optic or global positioning system (GPS) communication is used to obtain data at a source end from one or more generators at receiving end(s), which is at a remote location from the source end, for SCV estimation. However, such approaches have economic challenges due to the cost associated with implementing and maintaining a high-speed communication network. Some approaches for SCV directly measure the rotor angle between the generator's internal voltage and terminal voltage for detecting power swing. In the absence of direct measurements, it is difficult to determine the power swing condition.

In one known SCV approach, the relationship between the SCV and a swing angle (θ) of a two-source equivalent system may be determined as per the below equation:

$$SVC = \pm E \times \cos\left(\frac{\theta}{2}\right)$$

where, E is an internal voltage of a source-end generator

In such approaches, the power swing may be detected by calculating a rate of change of the SCV. The time derivative of the SCV is given by below equation:

$$\frac{d(SCV)}{dt} = \frac{E}{2} \times \sin\left(\frac{\theta}{2}\right)\frac{d\theta}{dt}$$

In this equation, for sin (θ/2) to be close to one, θ should be around 180 degrees (for example, between 90 and 180 degrees). Therefore, the above equation can be used for detecting power swing when the value of θ is around 180 degrees. However, for values of θ between 0 and 90 degrees, the above equation will result in sin (θ/2) to be close to zero. In other words, this approach is not suitable for a smaller range of values of θ (for example, between 0 and 90 degrees).

BRIEF DESCRIPTION

In accordance with one embodiment, a method for detection of power swing for at least a first range of swing angles between an internal voltage ($E_S$) of a source-end generator and an internal voltage ($E_R$) of a receiving-end generator is provided. The method includes obtaining a voltage magnitude ($V_S$) of the source-end generator, and a current magnitude ($I_S$) of the source-end generator. The method further includes estimating a total reactance (X) between the source-end generator and the receiving-end generator, and estimating a first swing angle (θ) between the $E_S$ and the $E_R$ as a function of the obtained $V_S$, the obtained $I_S$ and the estimated X. The method further includes detecting a power swing condition based on the estimated θ.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of terms such as "including," "comprising," or "having" and variations thereof herein are meant to encompass the items listed thereafter and equivalents thereof as well as additional items. The terms "module," "controller," "processing unit," "storage unit," and "input/output (I/O unit)" may include either a single component or a plurality of components, which are either active, or passive, or both, and are connected or otherwise coupled together to provide the described function.

Additionally, for purposes of explanation, specific numbers, materials, and configurations are set forth in order to provide a thorough understanding of various embodiments of the invention. The skilled artisan will recognize the interchangeability of various features from different embodiments. Similarly, the various method steps and features described, as well as other known equivalents for each such methods and features, can be mixed and matched by one of ordinary skill in this art to construct additional assemblies and techniques in accordance with principles of this disclosure.

Various embodiments of the present invention provide devices and methods to detect a power swing condition (herein referred to as "power swing") in an electrical power system based on local measurements and one or more system parameters. In various embodiments, the devices and methods may obtain local measurements including a voltage magnitude ($V_S$) of a source-end generator in the electrical system and a current magnitude ($I_S$) of the source-end generator. Various embodiments may further estimate one or more system parameters such as a total reactance (X) between the source-end generator and a receiving-end generator in the electrical system, for example. In some embodiments, a first swing angle ($\theta$) between an internal voltage ($E_S$) of the source-end generator and an internal voltage ($E_R$) of the receiving-end generator may be estimated as a function of the obtained voltage $V_S$, the obtained current magnitude $I_S$ and the estimated total reactance X. In certain embodiments, a power swing condition may be then detected based on the estimated value of $\theta$. In one embodiment, this technique of detecting power swing may be implemented for at least a first range of swing angles between $E_S$ and $E_R$, as will be described later. Related systems are also presented.

In one embodiment, a power swing detection device and a related electrical power system is presented.

Figure 1:
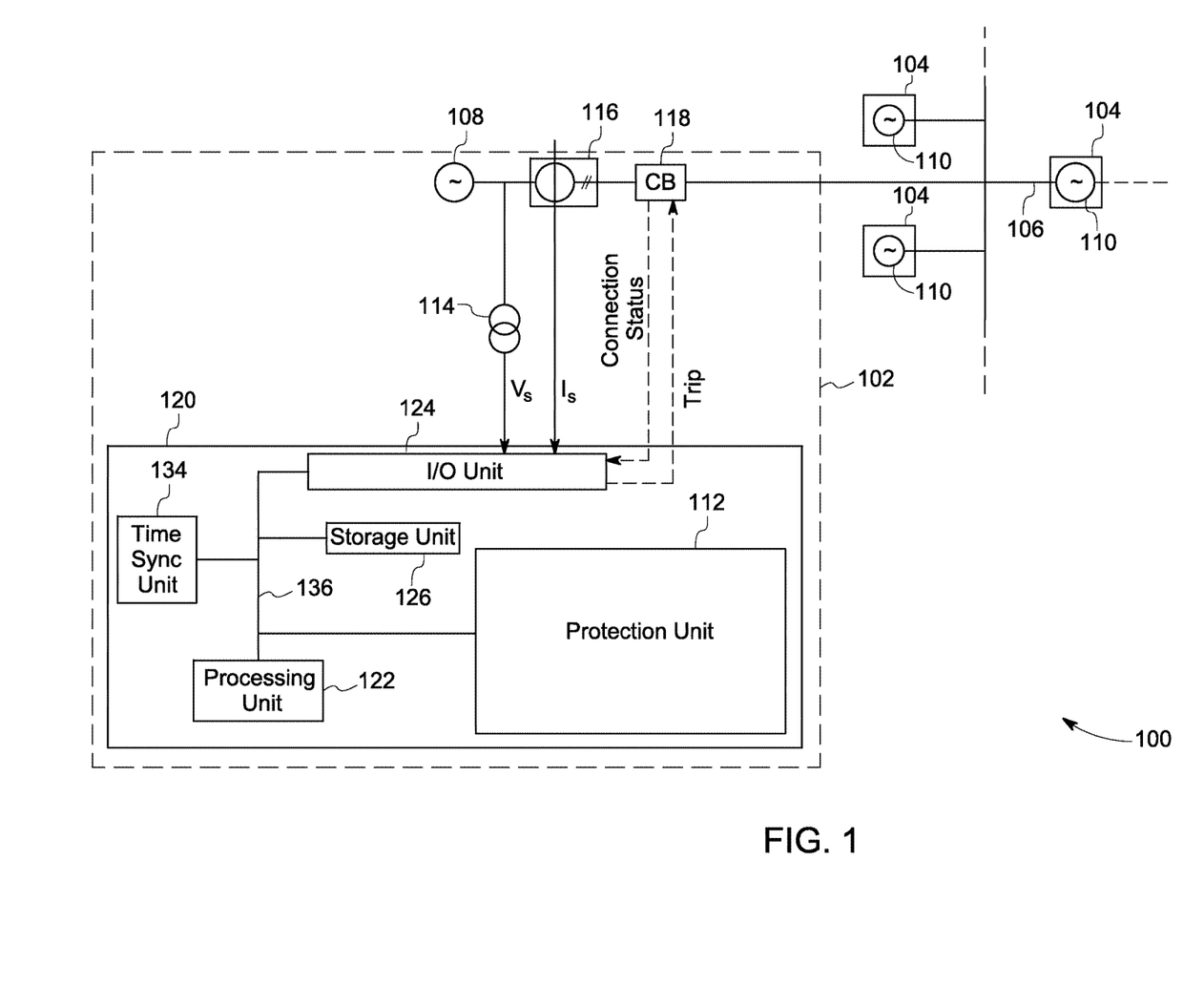
FIG. 1 depicts an electrical power system having multiple generators inter-connected in a mesh arrangement, in accordance with one embodiment.

FIG. 1 depicts an electrical power system 100 (herein referred to as "system 100") having multiple generators 104 and 108 inter-connected in a mesh arrangement, in accordance with one embodiment of the invention. The system 100 may be used for interconnecting alternating current (AC) power grids or microgrids. As shown in FIG. 1, in some embodiments, the system 100 may include a source-end 102 and one or more receiving-ends 104. The term "source-end" as used herein refers to a transmitting end of the system 100 and the term "receiving-end" refers to an end that receives power transmitted from the source-end 102 via a transmission link 106 such as, but not limited to, a transmission cable or a transmission line. As shown in FIG. 1, the source-end 102 includes a generator 108 (herein referred to as a "source-end generator 108") and each receiving-end 104 includes a generator 110 (herein together referred to as "receiving-end generator(s) 110") configured to be electrically coupled to the source-end generator 108. It will be apparent to a person skilled in the art that power swing may occur between any two generators (for example, between the source-end generator 108 and any of receiving-end generators 110) or between two groups of generators. Although FIG. 1 illustrates three receiving-end generators 110, any number of receiving-end generators may be deployed without deviating from the scope of the invention. Similarly, a plurality of source-end generators may be deployed in the system 100 instead of a single source-end generator 108 shown in FIG. 1, in accordance with some embodiments of the invention. In such embodiments, every source-end generator may include, or be coupled to, a protection unit as described later.

A power swing is a system phenomenon that is observed when a phase angle (herein referred to as a "swing angle") of one power source starts to vary in time with respect to another source in the same electrical system network. In some embodiments, the source-end generator 108 and one of the receiving-end generator 110 may be the two power sources. The term "swing angle ($\theta$)" herein refers to a phase angular separation between an internal voltage ($E_S$) of the source-end generator 108 and an internal voltage ($E_R$) of any of the receiving-end generators 110. When a two-source system loses stability and enters an out-of-step (OOS) condition, the angle difference (given by $\theta$) of the two generators, for example, the source-end generator 108 and any of receiving-end generators 110 may increase as a function of time. Therefore, $\theta$ provides information about power swing condition in an electrical power system, in accordance with some embodiments.

Components illustrated in the system 100 are exemplary and the system 100 may also include various other components (not shown in FIG. 1) such as, but not limited to, a turbine connected to the source-end generator 108, an automatic voltage regulator (AVR), a step-up transformer, a line-side breaker, and one or more electrical loads, for example.

The source-end 102 further includes a voltage transformer 114 for measuring a voltage magnitude ($V_S$) of the source-end generator 108, and a current transformer 116 for measuring a current magnitude ($I_S$) of the source-end generator 108. Although a single voltage transformer 114 and a single current transformer 116 are shown in FIG. 1, it will be appreciated by those skilled in the art that any number of current and voltage transformers may be deployed in the system 100 for sensing the local parameters such as $I_S$ and $V_S$. The term "local measurement" herein refers to a parameter that can be measured within the source-end 102 without the need to communicate with receiving-end generators 110.

As shown in FIG. 1, the system 100 further includes a circuit breaker (CB) 118 at the source-end 102. In some embodiments, the circuit breaker 118 is configured to electrically couple/decouple the source-end generator 108 with/from the receiving-end generators 110. In one embodiment, the circuit breaker 118 is a 52G generator circuit breaker.

The circuit breaker 118 may be configured to generate a connection status of the source-end generator 108. The term "connection status" as used herein refers to a status of the source-end generator 108 that indicates whether it is electrically connected to or disconnected from the rest of the system 100. In one embodiment, a high signal (for example, binary 1) may indicate that the circuit breaker 118 is closed and the source-end generator 108 is connected to the system 100, whereas a low signal (for example, binary 0) may indicate that the circuit breaker 118 is open and the source-end generator 108 is electrically disconnected from the system 100. In some embodiments, the connection status may be determined using other means. In one exemplary embodiment, current feedback such as the presence or absence of a current magnitude $I_S$ is used to determine the connection status of the source-end generator 108. In another embodiment, a combination of current feedback and circuit breaker position feedback is used to determine the connection status of the source-end generator 108. In some embodiments, the circuit breaker 118, the voltage transformer 114 and the current transformer 116 measure the corresponding data (such as, connection status, Vs, Is, and the like) in real-time. As will be described later, the system 100 may also estimate a system parameter such as a total reactance (X) between the source-end generator 108 and any of the receiving-end generators 110. This estimation may be performed in real-time, in accordance with some embodiments. In one embodiment, real-time may refer to the occurrence of event instantaneously, for example, in the order of milliseconds or microseconds. In another embodiment, real-time may be near real-time having a predetermined tolerance (for example, two percent) with respect to instantaneous real-time. In one exemplary embodiment where the data is received near real-time, a utility operator or a protection engineer viewing the data (for example at an I/O terminal) may not perceive any delay during display of data.

As shown in FIG. 1, the system 100 further includes a power swing detection device 120 (herein referred to as "device 120") at the source-end 102. The term "power swing detection device" as used herein refers to a component that is configured to detect power swing and protect the source-end generator 108 during power swing condition. This protection may be achieved by triggering the circuit breaker 118 to trip or by triggering an alarm, when such a condition is detected. Tripping the circuit breaker 118 may result in the source-end generator 108 being isolated or decoupled from the rest of the system 100. The device 120 may be a protection relay, such as, but not limited to, a digital, numeric, static, or electromechanical protection relay, in accordance with some embodiments.

Further, as illustrated in FIG. 1, the device 120 may include a processing unit 122 and an I/O unit 124, where the processing unit 122 may analyze data that is received at and transmitted from the I/O unit 124. The processing unit 122 may include, for example, one or more application-specific processors, graphical processing units, digital signal processors, microcomputers, microcontrollers, application specific integrated circuits (ASICs), field programmable gate arrays (FPGAs), or other suitable devices in communication with one or more components of the system 100. The I/O unit 124 may comprise one or more human I/O devices, which enable a utility operator or a protection engineer to communicate with the device 120 or one or more communications devices using any type of communications link. In some embodiments, the I/O unit 124 interfaces with the voltage transformer 114, the current transformer 116, and the circuit breaker 118 to receive local parameters (such as the $V_S$, the $I_S$) and the connection status, respectively. $V_S$ and $I_S$ may be analog inputs, for example, in the form of sine waveforms or square pulses, in accordance with certain embodiments. In one embodiment, the I/O unit 124 is configured to filter noise and then convert the filtered analog input into digital samples. In another embodiment, during the power swing condition, the I/O unit 124 is configured to trigger an alarm, or send a trip command to the circuit breaker 118 to trip the circuit breaker 118, or both.

The device 120 may further include a protection unit 112 and a storage unit 126. In some embodiments, the protection unit 112 executes program code, such as a swing detection scheme residing in the storage unit 126. In some embodiments, the protection unit 112 is a relay that is provided with a swing detection scheme to detect whether the system 100 is approaching power swing condition between the source-end generator 108 and any of the receiving-end generators 110 or not. In some alternate embodiments, the processing unit 122 may execute this swing detection scheme. In certain embodiments, the processing unit 122 stores the received, processed, and transmitted data to, or reads from, the storage unit 126, such as a hard disk drive, a floppy disk drive, a compact disk-read/write (CD-R/W) drive, a digital versatile disc (DVD) drive, a flash drive, or a solid-state storage device. In some embodiments, the processing unit 122 may be integrated with the protection unit 112.

Various embodiments of the invention deploy the swing detection scheme in the device 120 that is configured to detect a power swing condition based on real-time data measurements including $V_S$, $I_S$ and X. The term "swing detection scheme" herein refers to logic defined to detect a power swing condition and then selectively, reliably, and dependably protect the source-end generator 108 during unstable power swings, and retain the source-end generator 108 in operation during stable power swings. In some embodiments, where the swing detection scheme determines that the disturbance in the system 100 is an unstable power swing, the device 120 protects the source-end generator 108 by triggering the alarm, generator circuit breaker trip action, or both. Various embodiments of the swing detection schemes are described in detail later in conjunction with FIG. 2.

The device 120 may further include a time sync unit 134, which may be configured to receive time sync signal(s) from an external time synchronizing device to synchronize the device 120's internal clock, by means of which the device 120 may be synchronized with the absolute time. Any known technique for time synchronizing data, such as global positioning system (GPS) or timing protocols may be used without deviating from the scope of the invention. In some embodiments, various components of the device 120 may communicate with each other via a communication bus 136 in the device 120.

One or more components shown in FIG. 1 may be integrated into a single component. For example, the time sync unit 134 may be integrated with the I/O unit 124. Also, the functionalities of a component of the device 120 may be segregated or distributed across multiple components. For example, some or all logic of the protection unit 112 may be stored in the storage unit 126 and processed in the processing unit 122. In some embodiments, the functionalities of the I/O unit 124 may be integrated into one or more modules of the protection unit 112, in which case the I/O unit 124 may be omitted.

As used herein, the term "unit" within the device 120 refers to any configuration of hardware, with or without software, which implements the functionality described in conjunction therewith using any solution. Also, the term "module" herein refers to program code that enables the processing unit 122 to implement the actions described in conjunction therewith using any solution. Regardless, it is understood that two or more units, modules, or systems may share some or all of their respective hardware or software. Further, while performing a process described herein, the device 120 may communicate with one or more other computing components using any type of communications link. In some embodiments, the communications link may include, but is not limited to, wired links such as optical fiber, or wireless links. Further, the system 100 may further include any combination of one or more types of networks, or utilize any combination of various types of transmission techniques and protocols.

Figure 2:
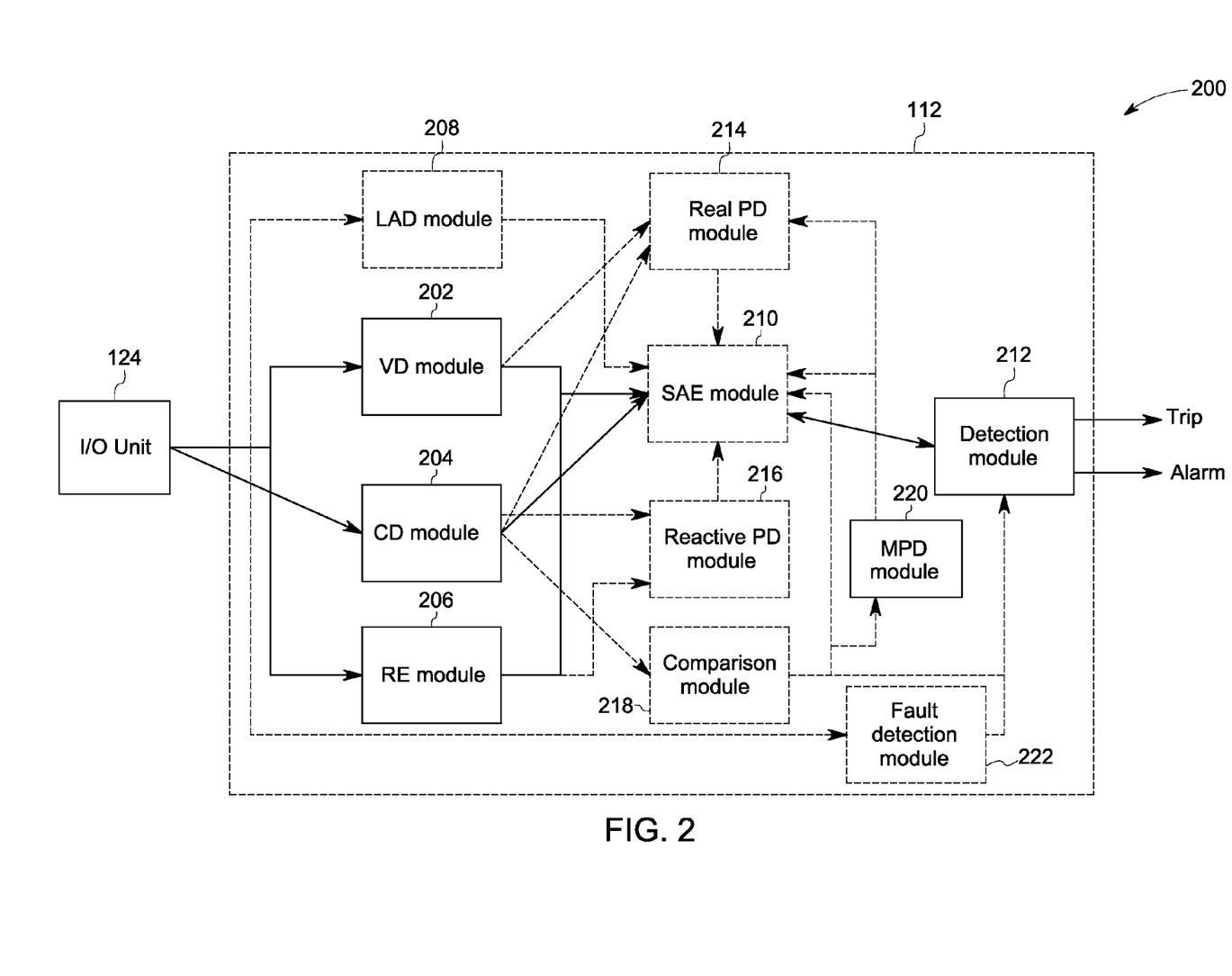
FIG. 2 is a block diagram of a power swing detection device, in accordance with one embodiment.

FIG. 2 is a block diagram of a power swing detection device 200 (herein referred to as "device 200"), in accordance with one embodiment of the invention. The device 200 is similar to the device 120, except that a detailed view of the protection unit 112 is shown in FIG. 2. In some embodiments, various components of the device 120 may be equally implemented in the device 200. As shown in FIG. 2, in some embodiments, the protection unit 112 includes a voltage determination (VD) module 202 coupled to the I/O unit 124 and is configured to obtain a voltage magnitude ($V_S$) of the source-end generator 108. The protection unit 112 further includes a current determination (CD) module 204 coupled to the I/O unit 124 and is configured to obtain a current magnitude ($I_S$) of the source-end generator 108. In one embodiment, the VD module 202 and the CD module 204 are configured to receive $V_S$ and $I_S$, respectively, from the respective voltage and current transformers 114 and 116. Alternatively, in another embodiment, the VD module 202 and the CD module 204 may be integrated with the respective voltage and current transformers 114 and 116 to measure $V_S$ and $I_S$ directly. In yet another embodiment, a phasor measurement unit (PMU) may be used to measure phasor values such as $V_S$ and $I_S$. In such an embodiment, the voltage and current transformers 114 and 116 may be omitted or implemented in addition to the PMU.

In some embodiments, as shown in FIG. 2, the protection unit 112 further includes a reactance estimation (RE) module 206 coupled to the I/O unit 124 and is configured to estimate a total reactance (X) between the source-end generator 108 and any of the receiving-end generators 110. Various embodiments here consider X as the total reactance for detecting power swing since impedances are generally dominated by reactance instead of resistance. In one exemplary embodiment, if there is a power swing in which θ swings around 180 degrees, the RE module 206 estimates X as a function of a maximum magnitude of current ($I_{max}$) determined during the power swing and a maximum magnitude of real power ($P_{max}$) determined during the power swing. In one such embodiment, X is estimated based on recorded historical swing conditions, using which $I_{max}$ and $P_{max}$ are determined. Once $I_{max}$ and $P_{max}$ are known, X is estimated using the equation below:

$$X \approx 4 \times \frac{P_{max}}{I_{max}^2}. \qquad \text{eq-1}$$

Any other known suitable estimation technique may be used to estimate X without deviating from the scope of the invention. For example, X may be estimated using system topology and line parameters.

In some embodiments, as shown in FIG. 2, the protection unit 112 additionally includes a load angle determination (LAD) module 208 coupled to the I/O unit 124 and is configured to obtain a load angle (α) between $V_S$ and $I_S$. In one exemplary embodiment, α may be obtained as a part of phasor values obtained using the PMU.

In some embodiments, as shown in FIG. 2, the protection unit 112 further includes a swing angle estimation (SAE) module 210 coupled to the modules 202, 204, 206 and 208. In one embodiment, the SAE module 210 is configured to estimate a first swing angle (θ) between $E_S$ and $E_R$ as a function of the obtained $V_S$, the obtained $I_S$ and the estimated X. In another embodiment, the SAE module 210 is configured to estimate the value of θ as a function of obtained α, in addition to the obtained $V_S$, the obtained $I_S$, and the estimated X. The value of θ may be derived from the equations of real power (P) and current ($I_S$) given below:

$$P = \frac{E_S \times E_R}{X} \times \sin(\theta) = 2 \times \frac{E_S \times E_R}{X} \times \sin\left(\frac{\theta}{2}\right) \times \cos\left(\frac{\theta}{2}\right) \qquad \text{eq-2}$$

$$I_S = 2 * \frac{E_S}{X} * \left|\sin\left(\frac{\theta}{2}\right)\right|. \qquad \text{eq-3}$$

In order to deduce the equation for θ, $E_S$ is assumed equal to $E_R$ and is referenced by 'E,' in accordance with various embodiments. Adding this assumption in equations 2 and 3, the following equations for P and $I_S$ may be derived.

$$P = \frac{E^2}{X} \times \sin(\theta) = 2 \times \frac{E^2}{X} \times \sin\left(\frac{\theta}{2}\right) \times \cos\left(\frac{\theta}{2}\right) \qquad \text{eq-4}$$

$$I_S = 2 * \frac{E}{X} * \left|\sin\left(\frac{\theta}{2}\right)\right|. \qquad \text{eq-5}$$

Multiplying ($I_S$*X)/2 on both sides of equation 5 and replacing $I_S$ on the right side of the equation 5 with the $I_S$ formula given in equation 5, the below equation may be derived:

$$\frac{I_S^2 \times X}{2} = 2 \times \frac{E^2}{X} \times \sin\left(\frac{\theta}{2}\right) \times \sin\left(\frac{\theta}{2}\right). \qquad \text{eq-6}$$

In some embodiments, θ is derived by combining equations 4 and 6 as given in the equations below:

$$\tan\left(\frac{\theta}{2}\right) = \frac{X \times I_S^2}{2 \times P} \qquad \text{eq-7}$$

$$\theta = 2 \times a\tan 2\left(\frac{X \times I_S^2}{2}, P\right). \qquad \text{eq-8}$$

Any known technique may be used to determine P from the obtained $V_S$ and $I_S$. In one example, P is determined using instantaneous values of line to neutral voltage (V) and line current (I) for each phase, which are $V_a * I_a$, $V_b * I_b$ and $V_c * I_c$ (where, a, b and c correspond to three phases in case the system 100 is a three-phase AC power system). The sum of $V_a * I_a$, $V_b * I_b$ and $V_c * I_c$ results in instantaneous three phase real power (P). In another example, P may be determined using the product of phasor values, that is, $V_S$, $I_S$ and a function of α (for example, cos α) determined, for example, from PMU.

In some embodiments, as shown in FIG. 2, the protection unit 112 further includes a detection module 212 coupled to the SAE module 210. The detection module 212 in such embodiments is configured to detect power swing based on the estimated θ. Any known technique of detecting power swing based on θ may be used herein without deviating from the scope of the invention. In one exemplary embodiment, a threshold value is defined and compared with the estimated θ. In such an embodiment, when θ exceeds this defined threshold value, the system is defined as out-of-step or unstable, as a result of which the circuit breaker 118 is tripped to isolate the source-end generator 108 from the rest of the system 100, or an alarm is triggered.

In some other embodiments, the SAE and detection modules 210 and 212 may use additional parameter(s) to detect power swing. In one such embodiment, the protection unit 112 includes a real power determination (real PD) module 214 and a reactive power determination (reactive PD) module 216. In one embodiment, the real PD module 214 is configured to determine P based on the obtained $V_S$ and $I_S$. In another embodiment, the reactive PD module 216 is configured to determine a reactive power value (Q) based on the obtained $I_S$ and the estimated X. In one exemplary embodiment, Q may be determined using the below equation:

$$Q = \frac{I^2 \cdot X}{2}. \qquad \text{eq-9}$$

In such embodiments, the SAE module 210 may be configured to estimate an additional parameter such as a rate of change of swing angle ($\dot{\theta}$) as a function of the P and Q determined using the modules 214 and 216, respectively. In order to derive an equation for $\dot{\theta}$, equations θ and 9 may be used along with equation 10 for apparent power (S) to obtain equations 11 and 12:

$$S = \sqrt{P^2 + Q^2} \qquad \text{eq-10}$$

$$P = S \times \cos\left(\frac{\theta}{2}\right) \qquad \text{eq-11}$$

$$Q = S \times \sin\left(\frac{\theta}{2}\right) \qquad \text{eq-12}$$

Further, a rate of change of P ($\dot{P}$) and a rate of change of Q ($\dot{Q}$) may be derived from equations 11 and 12:

$$\dot{P} = \dot{S} \times \cos\left(\frac{\theta}{2}\right) - \frac{\dot{\theta}}{2} \times S \times \sin\left(\frac{\theta}{2}\right) \qquad \text{eq-13}$$

$$\dot{Q} = \dot{S} \times \sin\left(\frac{\theta}{2}\right) + \frac{\dot{\theta}}{2} \times S \times \cos\left(\frac{\theta}{2}\right) \qquad \text{eq-14}$$

where, $\dot{S}$ is a rate of change of S.

Equations 13 and 14 may be solved to express $\dot{\theta}$ in terms of the rate of change of P ($\dot{P}$) and Q ($\dot{Q}$).

$$\dot{\theta} = 2 \times \left(\frac{P \times \dot{Q} - Q \times \dot{P}}{P^2 + Q^2}\right) \qquad \text{eq-15}$$

$\dot{P}$ and $\dot{Q}$ may be determined using the following equations:

$$\dot{P} = \frac{P(t(k)) - P(t(k-1))}{t(k) - t(k-1)} \qquad \text{eq-16}$$

$$\dot{Q} = \frac{Q(t(k)) - Q(t(k-1))}{t(k) - t(k-1)} \qquad \text{eq-17}$$

where,
P(t(k)) represents a real power measured at a time instance t(k),
P(t(k−1)) represents a real power measured at a time instance t(k−1); t(k−1) is a time instance prior to t(k),
Q(t(k)) represents a reactive power measured at the time instance t(k), and
Q(t(k−1)) represents a reactive power measured at the time instance t(k−1)

In certain embodiments, the detection module 212 may be configured to detect the power swing based on the estimated θ and $\dot{\theta}$. Any known technique of detecting power swing based on θ and $\dot{\theta}$ may be used herein without deviating from the scope of the invention. In one exemplary embodiment, during a power swing, the swing energy transfers back and forth between θ and $\dot{\theta}$; therefore the power swing or an out-of-step condition may be detected using a weighted sum of the squares of θ and $\dot{\theta}$. In one such embodiment, power swing or out-of-step condition is determined when the below condition is met:

$$\left(\frac{\theta}{\theta_{max}}\right)^2 + \left(\frac{\dot{\theta}}{\dot{\theta}_{max}}\right)^2 > 1 \qquad \text{eq-18}$$

where, $\theta_{max}$ and $\dot{\theta}_{max}$ are maximum allowed swing angle and maximum allowed rate of change of swing angle, respectively.

In one embodiment, configurations of various modules in the device 200 may be used for all values of swing angles. Alternatively, in another embodiment, various configurations described above for the RE module 206, the SAE module 210, and the detection module 212 may be provided for only a first range of swing angles between $E_S$ and $E_R$. In one embodiment, the first range of swing angles may include large values of θ. For example, 90 to 180 degrees may be defined as large values of θ. More specifically, 120 to 180 degrees may be defined as large values of θ. However, for smaller values of θ (that is, second range of swing angles), a different approach may be used to detect swing condition. The second range of swing angles may include small values of θ. For example, 0 to 90 degrees may be defined as small values of θ. More specifically, 0 to 30 degrees may be defined as small values of θ. For small values of θ, the magnitude of the current ($I_S$) is also small. Therefore, for small values of the θ, the power swing may be detected by comparing the magnitude of $I_S$ with a current threshold value ($I_{min}$). In one exemplary embodiment, a utility operator may define $I_{min}$ anywhere between, for example, 1.1 to 1.2 pu. Specifically, in another example, $I_{min}$ may be defined as 1.1 pu. In such embodiments, a swing angle that may cause $I_S$ to flow below 1.1 pu may be defined as a small value of θ.

In some embodiments, as shown in FIG. 2, the protection unit 112 additionally includes a comparison module 218 coupled to the CD module 204 and the SAE module 210. The comparison module 218 is configured to compare the $I_S$ obtained from the CD module 204 with $I_{min}$. In one embodiment, when the obtained $I_S$ is greater than or equal to the $I_{min}$, the comparison module 218 is configured to notify the SAE and detection modules 210 and 212 to estimate θ and detect power swing based on the estimated θ as described above. Alternatively, in another embodiment, when the obtained $I_S$ is less than the $I_{min}$, the comparison module 218 is configured to send a deactivation signal to the SAE and detection modules 210 and 212 for deactivation of these two modules. Deactivation of SAE and detection modules 210 and 212 results in discontinuing the process of estimation of θ and detection of power swing.

Alternatively, in another embodiment, when the obtained $I_S$ is less than the $I_{min}$, the comparison module 218 is configured to send modification signals to the SAE and detection modules 210 and 212 to modify the configurations of these modules in order to compute different swing angle using a different approach. In such an embodiment, the protection unit 112 may additionally include a maximum power determination module 220 that is coupled to the comparison module 218 and is configured to determine a maximum magnitude of power ($P_{max}$) transmitted from the source-end generator 108 to any of the receiving-end generators 110. Also, in such embodiments, the real PD module 214 may be used to determine P based on the obtained $V_S$ and $I_S$. In one embodiment, the modification signal received at the SAE module 210 triggers the SAE module 210 to change its configuration to estimate a second swing angle ($\theta_1$) between $E_S$ and $E_R$ as a function of the determined P and $P_{max}$. In order to determine $\theta_1$, equation 4 may be re-written approximately (replacing θ with $\theta_1$) as below:

$$P \approx \frac{E^2}{X} \times \theta_1 \approx P_{max} \times \theta_1. \qquad \text{eq-19}$$

$\theta_1$ may be determined from equation 19 as per the equation below:

$$\theta_1 \approx \frac{P}{P_{max}}. \qquad \text{eq-20}$$

In one embodiment, $P_{max}$ is determined from equation 19 as a function of E and X.

In one embodiment, when the obtained $I_S$ is less than the $I_{min}$, the modification signal received at the detection module 212 triggers the detection module 212 to change its configuration to detect the power swing based on this $\theta_1$.

In another embodiment, when the obtained $I_S$ is less than the $I_{min}$, the modification signal received at the detection module 212 triggers the detection module 212 to change its configuration to detect the power swing based on $\theta_1$ and a rate of change of $\theta_1$ ($\dot{\theta}$). In such an embodiment, the SAE module 210 may be configured to additionally estimate $\dot{\theta}_1$ as a function of $\dot{P}$ and $P_{max}$. $\dot{\theta}_1$ may be determined using the equation below:

$$\dot{\theta}_1 \approx \frac{\dot{P}}{P_{max}}. \qquad \text{eq-21}$$

In one embodiment, as shown in FIG. 2, the protection unit 112 may optionally include a fault detection module 222 to determine a fault condition at the source-end 102. The fault detection module 222 determines whether it is a normal condition or a fault condition. In one exemplary embodiment, the detection module 212 differentiates power swing condition from fault condition and sends this information to the fault detection module 222 for performing appropriate action. In another embodiment, the fault detection module 222 may be implemented in a device other than the device 200. In such embodiments, upon detection of the fault condition, various modules shown in FIG. 2 may be bypassed and the fault detection module 222 may be configured to send a fault notification to the detection module 212 (or some other module) in order to trip the circuit breaker 118.

In some other embodiments, after detecting the power swing, the device 200 determines whether the power swing is stable or unstable. Any known technique may be used for determining stable or unstable power swing. In one exemplary embodiment, when θ increases for some time duration and then starts to decrease, such a power swing is determined as a stable swing. However, when θ increases continuously for the entire monitored time duration, such a power swing is determined as an unstable swing.

Figure 3:
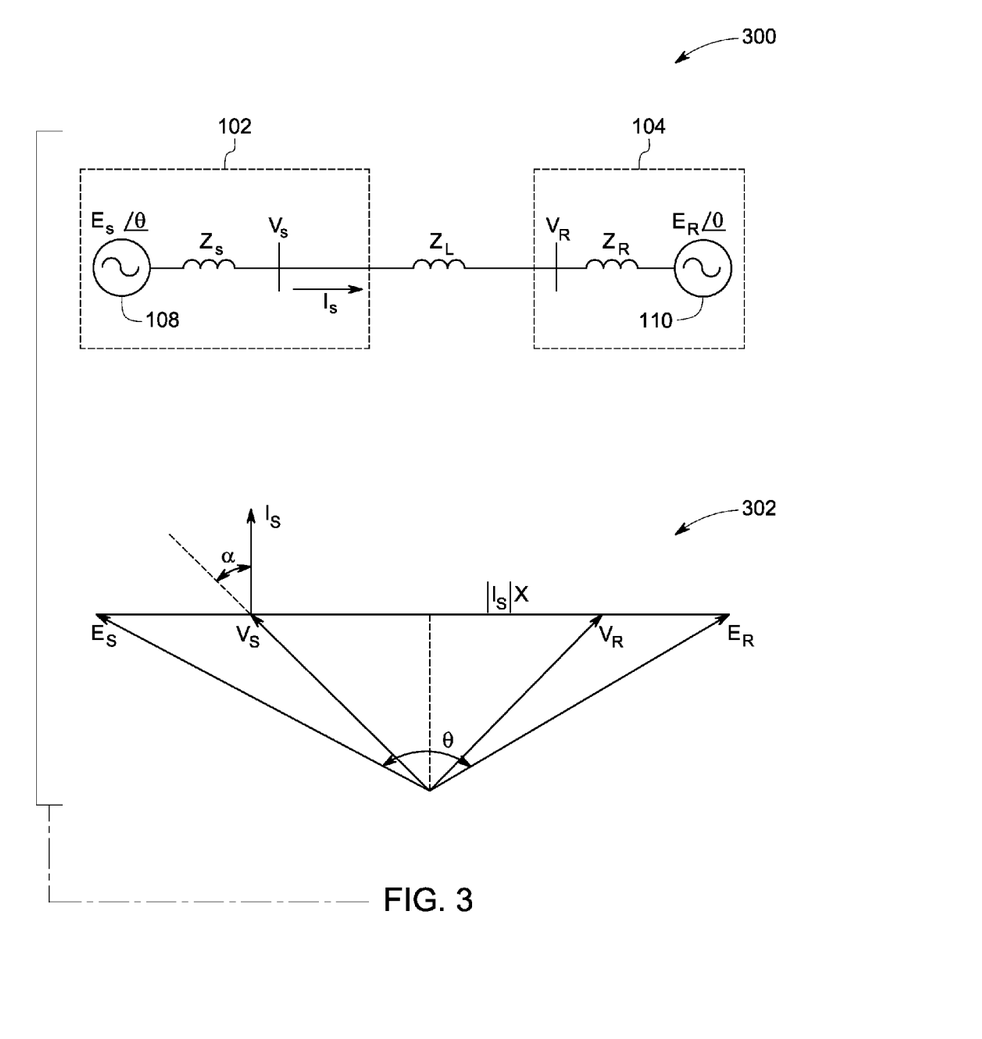
FIG. 3 represents a two-source system and a vector phasor representation of the two-source system, in accordance with one embodiment of the invention.

FIG. 3 represents a two-source system 300 and a vector phasor representation 302 of the two-source system 300, that is, the source-end 102 and the receiving-end 104, in accordance with one embodiment. The two-source system 300 is a configuration of a simplest network for studying the power swing phenomenon, as shown in FIG. 3. The source-end generator 108 has a swing angle equal to θ, and this angle may vary during the power swing. The receiving-end generator 110 represents an infinite bus and its angle may not vary with time. This simple network may be used to model the power swings taking place in more complex networks. In some embodiments, when the two-source system 300 loses stability and enters a power swing condition, the angle difference between the two sources 108 and 110, represented by θ, may increase as a function of time.

Figure 4:
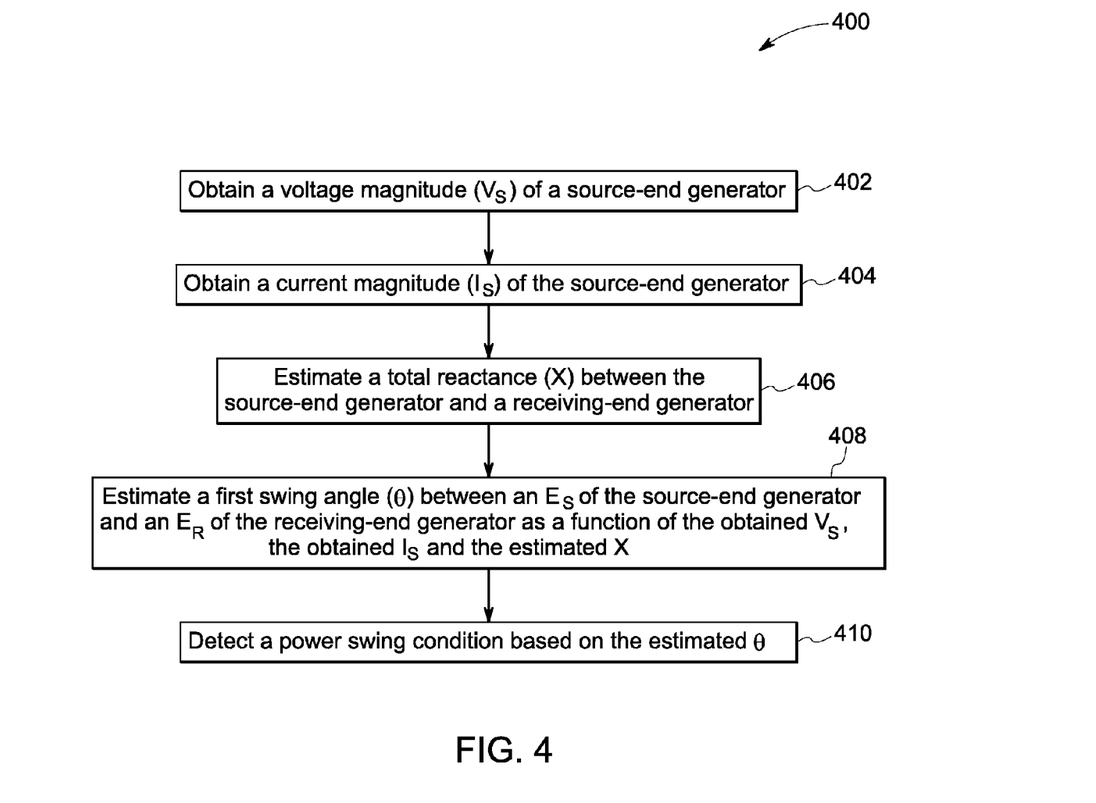
FIG. 4 is a flowchart depicting a method for detection of power swing in the electrical power system, in accordance with one embodiment of the invention.

In one embodiment, a method for detecting power swing is presented. FIG. 4 is a flowchart depicting a method 400 for detecting power swing in an electrical power system (such as 100), in accordance with one embodiment of the invention. The method 400 detects power swing between a source-end generator (such as 108) and a receiving-end generator (such as one of the receiving-end generators 110) based on local measurements and one or more system parameters. In some embodiments, a power swing detection device (such as 120) including a protection unit (such as 112), for example, a relay may be provided with a swing detection scheme to detect power swing between the source-end generator and receiving-end generators. At steps 402 and 404, local measurements including a voltage magnitude ($V_S$) and a current magnitude ($I_S$) of the source-end generator are obtained. In some embodiments, a voltage determination (VD) module (such as 202) obtains $V_S$ and a current determination (CD) module (such as 204) obtains $I_S$. In one embodiment, the VD and CD modules are configured to receive $V_S$ and $I_S$, respectively, from respective current (such as 116) and voltage transformers (such as 114). Alternatively, in another embodiment, these modules may be integrated with the respective current and voltage transformers to measure $V_S$ and $I_S$ directly. In yet another embodiment, a phasor measurement unit (PMU) may be used to measure phasor values such as $V_S$ and $I_S$.

Further, at step 406, a total reactance (X) between the source-end generator and the receiving-end generator is estimated. In one embodiment, a reactance estimation (RE) module (such as 206) estimates X as a function of a maximum magnitude of current ($I_{max}$) determined during the power swing and a maximum magnitude of real power ($P_{max}$) determined during the power swing. Any other known estimation technique may be used to estimate X without deviating from the scope of the invention. In another embodiment, a load angle ($\alpha$) between $V_S$ and $I_S$ may be obtained. In one exemplary embodiment, $\alpha$ may be obtained as a part of phasor values obtained using the PMU.

At step 408, a first swing angle ($\theta$) between $E_S$ and $E_R$ is estimated as a function of the obtained $V_S$, the obtained $I_S$ and the estimated X. In one embodiment, a SAE module (such as 210) is used to estimate $\theta$ as a function of the obtained $V_S$, the obtained $I_S$ and the estimated X. Alternatively, in another embodiment, $\theta$ may be estimated as a function of obtained $\alpha$, in addition to the obtained $V_S$, the obtained $I_S$, and the estimated X. $\theta$ may be derived from the equations of real power (P) and current ($I_S$) given below. $\theta$ may be computed as described above in various embodiments of FIG. 2.

Finally, at step 410, the power swing is detected based on the estimated value of $\theta$. Any known technique of detecting power swing based on $\theta$ may be used herein without deviating from the scope of the invention. In one exemplary embodiment, a threshold value may be defined and a detection module (such as 212) may be used to compare the estimated $\theta$ with this threshold value. In such an embodiment, when the value of $\theta$ exceeds this defined threshold value, the system is determined to be out-of-step or unstable, as a result of which the circuit breaker 118 is tripped to isolate the source-end generator 108 from the rest of the system 100, or an alarm is triggered.

In some other embodiments, the SAE and detection modules may use additional parameter(s) such as a rate of change of swing angle ($\dot{\theta}$) as a function of the P and Q to detect power swing. $\dot{\theta}$ may be estimated as described above in various embodiments of FIG. 2. In certain embodiments, the detection module 212 may be configured to detect the power swing based on the estimated $\theta$ and $\dot{\theta}$. Any known technique of detecting power swing based on $\theta$ and $\dot{\theta}$ may be used herein without deviating from the scope of the invention. In one exemplary embodiment, power swing or out-of-step condition may be determined as per equation 18.

In one embodiment, configurations of various modules described in the method 400 may be used for all values of swing angles. Alternatively, in another embodiment, various configurations described above for the RE module, SAE module, and detection module 212 may be provided for only a first range of swing angles between $E_S$ and $E_R$, as described above in conjunction with FIG. 2. However, for smaller values of $\theta$ (that is, second range of swing angles), a different approach may be used to detect swing condition. The second range of swing angles may include small values of $\theta$, as described above in conjunction with FIG. 2.

Figure 5:
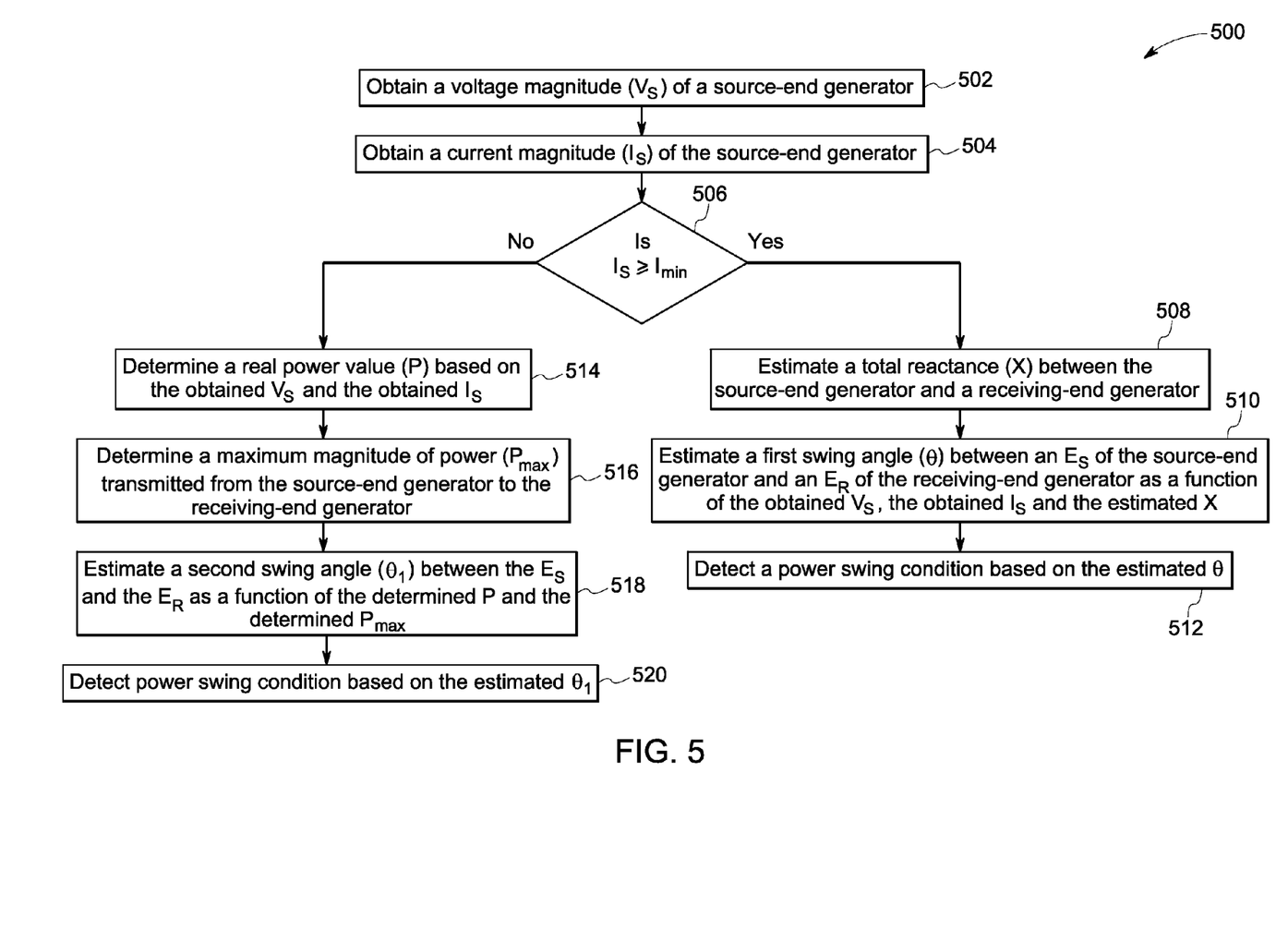
FIG. 5 is a flowchart depicting a method for detection of power swing in the electrical power system, in accordance with another embodiment of the invention.

FIG. 5 is a flowchart depicting a method 500 for detection of power swing in an electrical power system (such as 100), in accordance with another embodiment of the invention. Steps 502 and 504 are same as steps 402 and 404, respectively of the method 400. At step 506, $I_S$ obtained at step 504 is compared with a current threshold value ($I_{min}$). For small values of $\theta$, since the magnitude of the current ($I_S$) is also small, a comparison module (such as 218) detects power swing by comparing the magnitude of $I_S$ with $I_{min}$.

When the obtained $I_S$ is greater than or equal to the $I_{min}$, steps 508 to 512 are executed. Steps 508 to 512 are same as steps 406 to 410, respectively, of the method 400. In one embodiment, the comparison module may be configured to notify the SAE and detection modules to estimate the value of $\theta$ and to detect power swing based on the estimated value of $\theta$ as described in steps 406 to 410. Alternatively, in some other embodiments, the SAE and detection modules may use $\dot{\theta}$ as a function of the P and Q to detect power swing. In certain embodiments, the detection module may be configured to detect the power swing based on the estimated $\theta$ and $\dot{\theta}$.

However, when the obtained $I_S$ is less than the $I_{min}$, steps 514 to 520 are executed, in accordance with some embodiments. At step 514, a real power value (P) is determined based on the obtained $V_S$ and $I_S$.

Further, at step 516, a maximum magnitude of power ($P_{max}$) transmitted from the source-end generator to the receiving-end generator is determined.

Also, the comparison module may be configured to send modification signals to the SAE and detection modules to modify the configurations of these modules in order to compute a different swing angle using a different approach. At step 518, the modification signal received at the SAE module may trigger the SAE module to change its configuration to estimate a second swing angle ($\theta_1$) between $E_S$ and $E_R$ as a function of the determined P and $P_{max}$. In certain embodiments, $\theta_1$ may be determined using equation 20.

Finally, at step 520, when the obtained $I_S$ is less than the $I_{min}$, power swing is detected based on estimated $\theta_1$. In one embodiment, the modification signal received at the detection module may trigger the detection module to change its configuration to detect the power swing based on estimated $\theta_1$.

In one alternate embodiment, when the obtained $I_S$ is less than the $I_{min}$, the modification signal received at the detection module 212 triggers the detection module 212 to change its configuration to detect the power swing based on $\theta_1$ and a rate of change of $\theta_1$ ($\dot{\theta}_1$). In such an embodiment, the SAE module 210 is configured to additionally estimate $\dot{\theta}_1$ using equation 21.

Alternatively, in another embodiment, when the obtained $I_S$ is less than the $I_{min}$, the comparison module is configured to send a deactivation signal to the SAE and detection modules for deactivation of these two modules. Deactivation of SAE and detection modules may result in discontinuing the process of estimation of $\theta$ and detection of power swing.

The devices, systems, and methods in accordance with embodiments of the invention may obviate the need for remote measurements (and hence obviate the need for communication required with remote components such as receiving-end generators and associated components) for power swing detection using the swing detection scheme in various embodiments. Local measurements and one or more system parameters are used in various embodiments for power swing detection. Various embodiments may be implemented for generator protection or transmission-level OOS protection. Certain embodiments provide approaches to accurately detect power swing even when the value of $\theta$ is small.

The devices, systems, and methods described in various embodiments of the invention may be applied to any type of protection device, and is not limited to UR family of protection. Various embodiments of the invention are not limited to use in application areas such as an electric grid or a microgrid, and may be extended to any other type of application areas in the electrical power system.

It is to be understood that a skilled artisan will recognize the interchangeability of various features from different embodiments and that the various features described, as well as other known equivalents for each feature, may be mixed and matched by one of ordinary skill in this art to construct additional systems and techniques in accordance with principles of this disclosure. It is, therefore, to be understood that the appended claims are intended to cover all such modifications and changes as fall within the true spirit of the invention.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method, comprising:
   for at least a first range of swing angles between an internal voltage ($E_S$) of a source-end generator and an internal voltage ($E_R$) of a receiving-end generator:
   (i) obtaining a voltage magnitude ($V_S$) of the source-end generator in a voltage determination (VD) module of a power swing detection device;
   (ii) obtaining a current magnitude ($I_S$) of the source-end generator in a current determination (CD) module of the power swing detection device;
   (iii) estimating a total reactance (X) between the source-end generator and the receiving-end generator based on current and power values or based on system topology and line parameters in a reactance estimation (RE) module of the power swing detection device;
   (iv) estimating a first swing angle ($\theta$) between the $E_S$ and the $E_R$ as a function of the obtained $V_S$, the obtained $I_S$ and the estimated X in a swing angle estimation (SAE) module coupled to the VD module, the CD module and the RE module of the power swing detection device;
   (v) detecting a power swing condition when a function of the estimated $\theta$ exceeds a threshold value in a detection module coupled to the SAE module of the power swing detection device;
   (vi) comparing the obtained $I_S$ with a current threshold value ($I_{min}$) in a comparison module coupled to the CD module and the SAE module of the power swing detection device;
   (vii) executing steps (iv) and (v), when the obtained $I_S$ is greater than or equal to the $I_{min}$; and
   (viii) tripping a circuit breaker to isolate the source-end generator when the power swing condition is detected in the detection module;
   wherein for at least a second range of swing angles between the $E_S$ and the $E_R$ when the obtained $I_S$ is less than the $I_{min}$;
      determining a real power value (P) based on the obtained $V_S$ and the obtained $I_S$ in a real power determination (real PD) module of the power swing detection device;
      determining a maximum magnitude of power ($P_{max}$) transmitted from the source-end generator to the receiving-end generator in a maximum power determination (MPD) module coupled to the comparison module of the power swing detection device;
      estimating a second swing angle ($\theta_1$) between the $E_S$ and the $E_R$ as a function of the determined P and the determined $P_{max}$ in the SAE module; and
      detecting the power swing condition based on the estimated $\theta_1$ in the detection module.

2. The method of claim 1, wherein the step (iii) comprises estimating the X as a function of a maximum magnitude of current ($I_{max}$) determined during the power swing condition and maximum magnitude of power ($P_{max}$) determined during the power swing condition.

3. The method of claim 1, further comprising obtaining a load angle ($\alpha$) between the $V_S$ and the $I_S$.

4. The method of claim 3, wherein the step (iv) comprises estimating the $\theta$ as a function of the obtained $\alpha$.

5. The method of claim 1, further comprising:
   determining a real power value (P) based on the obtained $V_S$ and the obtained $I_S$;
   determining a reactive power value (Q) based on the obtained $I_S$ and the estimated X; and
   estimating a rate of change of swing angle ($\dot{\theta}$) as a function of the determined P and the determined Q.

6. The method of claim 5, wherein the step (v) comprises detecting the power swing condition based on the estimated $\dot{\theta}$.

7. A power swing detection device, comprising:
   for at least a first range of swing angles between an internal voltage ($E_S$) of a source-end generator and an internal voltage ($E_R$) of a receiving-end generator:
      a voltage determination module configured to obtain a voltage magnitude ($V_S$) of the source-end generator;
      a current determination module configured to obtain a current magnitude ($I_S$) of the source-end generator;
      a reactance estimation module configured to estimate a total reactance (X) between the source-end generator and the receiving-end generator based on current and power values or based on system topology and line parameters;
      a swing angle estimation module configured to estimate a first swing angle ($\theta$) between the $E_S$ and the $E_R$ as a function of the obtained $V_S$, the obtained $I_S$ and the estimated X;
      a detection module configured to detect a power swing condition when a function of the estimated $\theta$ exceeds a threshold value; and
      a comparison module configured to compare the obtained $I_S$ with a current threshold value ($I_{min}$), wherein the comparison module is configured to send a deactivation signal to the swing angle estimation and detection modules for deactivation thereof when the obtained $I_S$ is less than the $I_{min}$,
   wherein the detection module trips a circuit breaker and isolates the source-end generator when the power swing condition is detected.

8. The power swing detection device of claim 7, wherein the reactance estimation module is configured to estimate the X as a function of a maximum magnitude of current ($I_{max}$) determined during the power swing condition and a maximum magnitude of real power ($P_{max}$) determined during the power swing condition.

9. The power swing detection device of claim 7, further comprising a load angle determination module configured to obtain a load angle ($\alpha$) between the $V_S$ and the $I_S$.

10. The power swing detection device of claim 9, wherein the swing angle estimation module is configured to estimate the $\theta$ as a function of the obtained $\alpha$.

11. The power swing detection device of claim 7, further comprising:

a real power determination module configured to determine a real power value (P) based on the obtained $V_S$ and the obtained $I_S$; and a reactive power determination module configured to determine a reactive power value (Q) based on the obtained $I_S$ and the estimated X, wherein the swing angle estimation module is configured to estimate a rate of change of swing angle ($\dot{\theta}$) as a function of the determined P and the determined Q.

12. The power swing detection device of claim 11, wherein the detection module is configured to detect the power swing condition based on the estimated $\dot{\theta}$.

13. The power swing detection device of claim 7, wherein for at least a second range of swing angles between the $E_S$ and the $E_R$ when the obtained $I_S$ is less than the $I_{min}$, further comprises:

a real power determination module configured to determine a real power value (P) based on the obtained $V_S$ and the obtained $I_S$; and a maximum power determination module configured to determine a maximum magnitude of power ($P_{max}$) transmitted from the source-end generator to the receiving-end generator, wherein:

the swing angle estimation module is configured to estimate a second swing angle ($\theta_1$) between the $E_S$ and the $E_R$ as a function of the determined P and the determined $P_{max}$, and the detection module is configured to detect the power swing condition based on the estimated $\theta_1$.

14. An electrical power system, comprising:

a receiving-end generator;

a source-end generator configured to be electrically coupled to the receiving-end generator; and a power swing detection device, comprising:

for at least a first range of swing angles between an internal voltage ($E_S$) of the source-end generator and an internal voltage ($E_R$) of the receiving-end generator:

a voltage determination module configured to obtain a voltage magnitude ($V_S$) of the source-end generator;

a current determination module configured to obtain a current magnitude ($I_S$) of the source-end generator;

a reactance estimation module configured to estimate a total reactance (X) between the source-end generator and the receiving-end generator based on current and power values or based on system topology and line parameters;

a swing angle estimation module configured to estimate a first swing angle ($\theta$) between the $E_S$ and the $E_R$ as a function of the obtained $V_S$, the obtained $I_S$ and the estimated X;

a detection module configured to detect a power swing condition when a function of the estimated $\theta$ exceeds a threshold value; and a comparison module configured to compare the obtained $I_S$ with a current threshold value ($I_{min}$), wherein the comparison module is configured to send a deactivation signal to the swing angle estimation and detection modules for deactivation thereof when the obtained $I_S$ is less than the $I_{min}$, wherein the detection module trips a circuit breaker and isolates the source-end generator when the power swing condition is detected.

15. The electrical power system of claim 1, wherein the swing angle estimation module is configured to estimate the $\theta$ as a function of a load angle ($\alpha$) between the $V_S$ and the $I_S$.

16. The electrical power system of claim 14, wherein the power swing detection device further comprises:

a real power determination module configured to determine a real power value (P) based on the obtained $V_S$ and the obtained $I_S$; and a reactive power determination module configured to determine a reactive power value (Q) based on the obtained $I_S$ and the estimated X, wherein the swing angle estimation module is configured to estimate a rate of change of swing angle ($\dot{\theta}$) as a function of the determined P and the determined Q, and the detection module is configured to detect the power swing condition based on the estimated $\dot{\theta}$.

17. The electrical power system of claim 14, wherein for at least a second range of swing angles between the $E_S$ and the $E_R$, the power swing detection device further comprises:

a comparison module configured to compare the obtained $I_S$ with the current threshold value ($I_{min}$);

when the obtained $I_S$ is less than the $I_{min}$:

a real power determination module configured to determine a real power value (P) based on the obtained $V_S$ and the obtained $I_S$;

a maximum power determination module configured to determine a maximum magnitude of power ($P_{max}$) transmitted from the source-end generator to the receiving-end generator, wherein:

the swing angle estimation module is configured to estimate a second swing angle ($\theta_1$) between the $E_S$ and the $E_R$ as a function of the determined P and the determined $P_{max}$, and the detection module is configured to detect the power swing condition based on the estimated $\theta_1$.

* * * * *